United States Patent [19]

Brady

[11] Patent Number: 5,426,772
[45] Date of Patent: Jun. 20, 1995

[54] SINGLE PAL CIRCUIT GENERATING SYSTEM CLOCK AND CONTROL SIGNALS TO MINIMIZE SKEW

[75] Inventor: Gary Brady, Hillsboro, Oreg.

[73] Assignee: Intel Corporation, Santa Clara, Calif.

[21] Appl. No.: 107,340

[22] Filed: Aug. 16, 1993

Related U.S. Application Data

[63] Continuation of Ser. No. 558,331, Jul. 26, 1990, abandoned.

[51] Int. Cl.⁶ .................. G06F 1/00; G06F 1/04; G06F 1/10
[52] U.S. Cl. .................. 395/550; 364/DIG. 1; 364/270; 364/270.1; 395/775
[58] Field of Search ............... 395/550, 325, 250, 775

[56] References Cited

U.S. PATENT DOCUMENTS

| | | | |
|---|---|---|---|
| 4,851,995 | 7/1989 | Hsu et al. | 395/550 |
| 4,926,066 | 5/1990 | Maine et al. | 307/303.1 |
| 4,989,175 | 2/1991 | Boris et al. | 395/550 |
| 5,036,230 | 7/1991 | Bazes | 307/527 |
| 5,097,437 | 3/1992 | Larson | 395/775 |

Primary Examiner—Thomas C. Lee
Assistant Examiner—D. Dinh
Attorney, Agent, or Firm—Blakely, Sokoloff, Taylor & Zafman

[57] ABSTRACT

The invention is for improving the performance of a microprocessor system by reducing the skew between the system clock and critical control signals. Reduction in this skew reduces or eliminates the need for wait-states on data accesses to random access memory devices thereby improving system performance. A clock PAL is programmed to function as an asynchronous state machine to generate the clock signals and the memory device chip select. A clock source from an oscillator is input to the PAL. This clock source is buffered by the PAL and presented at the PAL outputs as the system clock. The memory device chip select is also generated inside this PAL using the source clock and other signals generated inside the PAL.

7 Claims, 4 Drawing Sheets

SINGLE PAL CIRCUIT GENERATING SYSTEM CLOCK AND CONTROL SIGNALS TO MINIMIZE SKEW

This is a continuation of application Ser. No. 07/558,331 filed Jul. 26, 1990, abandoned.

BACKGROUND OF THE INVENTION

1. Field of the Invention

The invention is for improving the performance of a microprocessor system by reducing the skew between the system clock and critical control signals. Reduction in this skew reduces or eliminates the need for waitstates on data accesses to memory devices thereby improving system performance.

2. Prior Art

Improved memory performance in the prior art was accomplished by using higher speed and higher cost, lower density SRAM devices. Custom clock chips with control signals have been developed, but none using a common/generic PAL device and asynchronous state machines.

Prior art methods use higher cost and lower density SRAMs or system performance is sacrificed. Therefore, the overall system cost is higher and the amount of zero waitstate memory available is less than that which is possible by use of the present invention.

For example, referring to FIG. 1 which is a block overview diagram showing how an SRAM might be accessed in the prior art using an Intel 89960KB microprocessor, an 80 MHz oscillator 11 is used to generate a 40 MHz CLK2 signal and a 20 MHz CLK signal using a counter 13 which simply divides the 80 MHz oscillator signal by two (for CLK2) and by four (for CLK). CLK2 and CLK are used to synchronize the transitions between address/data bus states. CLK2 is the clock input to the processor 15 and is double the processor operating frequency. CLK is the operating frequency of the processor.

SRAM 19 is accessed by the microprocessor based upon control signals generated by PALs 17 and by placing an address on the address/data bus which is latched by latch 21 when the signal address latch enable (/ALE) is asserted. Then, depending upon whether a read or write is to take place, as determined by the signal W/R, the addressed location in SRAM 19 is loaded from the address/data bus for a write, or is placed onto the address/data bus from the addressed location for a read. In 80960KB architecture, valid data bytes on the bus are indicated by byte enable signals (BE0, BE1, BE2 and BE3) generated by microprocessor 15. Write enable signals (WE3:WE0) are generated as a function of BE3:BE0 and W/R. That is within a 32 bit word being addressed, WE3:WE0 determine which of the four bytes in the word is to be written.

The details regarding the generation and usage of the four write enable signals, as well as the four output enable signals (OE3:OE0), A3:A2 and SRAMCS generated by PALs 17 for accessing SRAM 19 may be found in a publication of Intel Corporation known as the 80960KB Hardware Developer's Reference Manual. Although the description in the Hardware Developer's Reference Manual is explained using discrete logic gates, a PAL implementation would be readily apparent. The specific generation and usage details are not important for an understanding of the present invention. However, what is important to recognize is that the SRAMCS signal is generated by PALs 17 while the CLK and CLK2 signals are generated by counter 13. In this connection, the signal skew between SRAMCS and CLK2 and CLK created by virtue of the different components used to generate the signals requires additional waitstates when accessing SRAM 19. This skew requires the insertion of one or more waitstates between each data state in a read/write cycle.

For example, assuming four words (i.e., the maximum burst access for an 80960KB processor) of data are to be read from or written to SRAM, there is a one CLK address state followed by four one CLK data states, with each one CLK data state preceded by at least a one CLK waitstate, followed by a one CLK recovery state. Assuming one address state is TA, one data state is TD, one waitstate is TW and one recovery state is TR, the one CLK states for the above example would be TA, TW, TD, TW, TD, TW, TD, TW, TD, TR.

SUMMARY OF THE INVENTION

The invention is for improving the performance of a microprocessor system by reducing the skew between the system clock and critical control signals. Reduction in this skew reduces or eliminates the need for waitstates on data accesses to random access memory devices thereby improving system performance. For example, an Intel 80960KB microprocessor suffers an approximately 7% degradation in system performance for each waitstate. In this connection, although the description of the invention is with reference to an Intel 80960KB microprocessor system and utilizes the nomenclature of that chip, the technique can be implemented in conjunction with any general purpose microcontroller or microprocessor which makes memory accesses to static RAM devices (SRAM) by making changes which would be readily apparent to a person skilled in the art.

The performance of an SRAM may be improved by reducing the signal skew between the SRAM chip select signal (SRAMCS) and the system clock (CLK2 and CLK). In particular, according to the present invention, the SRAMCS signal is used to terminate the write cycle to the SRAM while the overall skew is controlled to less than +/−2 ns at the end of a 40 ns clock period by utilizing a commercially available PAL device and generating SRAMCS and the system clocks using asynchronous state machines. In this manner, the normal clock to chip select skew (or any control signal) is reduced by at least a factor of 3. Reducing the skew between the system clock and critical control signals has many other potential applications.

DETAILED DESCRIPTION OF THE INVENTION

Figure 1:
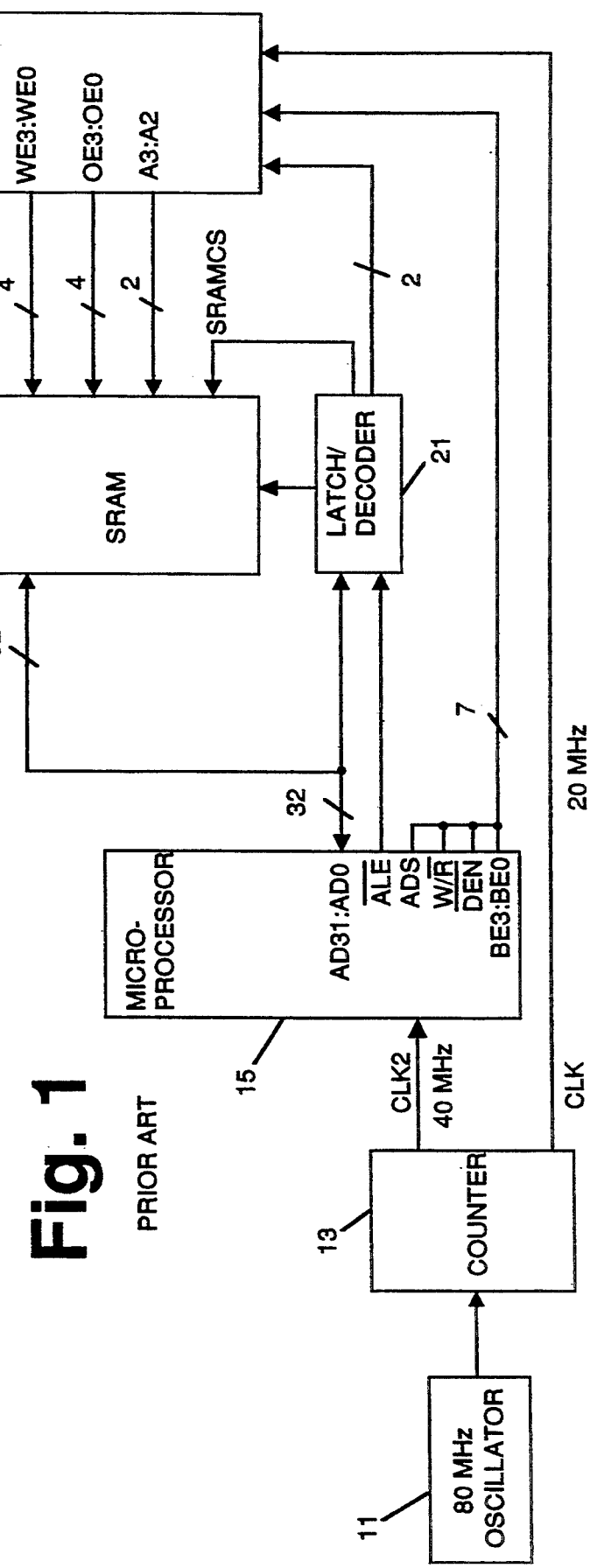
FIG. 1 is a block diagram of a microprocessor/SRAM system showing how the SRAM might be accessed in the prior art.

The invented technique of improving SRAM memory performance by reducing the skew between the clock and the SRAM chip select involves three major changes to prior art techniques.

First and most importantly, a 16L8-7 Programmable Logic Device (clock PAL 29) programmed to function as an asynchronous state machine is used to generate the signals CLK2 (50 MHz), CLK (25 MHz), system clock state zero (CLKS0) (25 MHz), and SRAM chip select (SRAMCS). A 50 MHz clock source (ICLK) from an oscillator 25 is input to the PAL. It should be noted that in the prior art typically the oscillator frequency is divided by two or some other multiple to obtain the processor clock signal, i.e., CLK2. However, by the technique of the present invention, the processor clock is the same frequency as the oscillator. Further, currently available standard TTL oscillators and counters are incapable of operating reliably so as to provide clock signals at the high frequencies provided according to the teachings of the present invention.

This 50 MHz clock is buffered by the PAL and presented at the PAL outputs as CLK2. ICLK is also used by an asynchronous state machine inside PAL 29 to generate the CLK and CLKS0 signals. SRAMCS is also generated inside this PAL using the signals ICLK, CLK, CLKS0, WR, SRSPACE, CYCLE and READY that indicate an SRAM cycle according to the logic equation set forth below. The logic which generates the critical SRAM chip select low to high transition at the end of a 40 ns clock period uses the same rising edge of the ICLK 50 MHz clock input to the PAL that the CLK2 uses to terminate the cycle and force a data inactive signal. Thus, since the critical edge of SRAMCS and CLK2 (which the 80960 processor uses to generate data), CLK, and CLKS0 are all generated off the same input transition of the 50 MHz ICLK signal, the skew between these outputs is less than $+/-1$ ns or the skew of the 16L8-7 PAL.

It is important to note that the logic equations set forth below which are used to generate SRAMCS and TDATCYC require both CLK and CLKS0 (which is 90 degrees out of phase from CLK). Also, although in the described implementation using an 80960KB processor the critical edge on SRAMCS occurs only on a write cycle, the invention can be used for any type access which requires low clock edge to control signal skew.

Second, all of the critical outputs of the PAL which are used at other points in the system are buffered by one common clock buffer 31, an 74F244. This buffer adds up to an additional $+/-1$ ns of skew.

Third, the trace routing of CLK2, CLK, SRAMCS, and the 80960 address/data bus are created so that the trace length of the SRAMCS line is less than or equal to the trace length of the CLK2 line and the 80960 address/data bus. Also, the termination and the loading are controlled to guarantee that the propagation of SRAMCS is less than the operation of the CLK2 and the 80960 address/data bus. Finally, impedance controlled printed circuit boards are used to guarantee the integrity of the termination networks in a production environment.

The result is that SRAMCS can be guaranteed to be within $+/-2$ ns of CLK2 and the 80960 address/data bus. The technique of skew reduction (or control) by a common clock buffer and by controlling the signal trace length, loading, and termination are known in the art. However, generating the system clocks and SRAM chip select in a common PAL device using asynchronous state machines is a totally new concept.

The invented design limits the skew between CLK2 and the SRAMCS to $+/-2$ ns. With improvement on this AC timing parameter, the SRAM design is able to operate at zero waitstates with lower cost and higher density SRAMs than is possible with other techniques of generating the SRAMCS signal using commonly available logic devices. Thus, the system performance is improved and the cost is lowered. Also the invented technique for generating a control signal and the clock using asynchronous state machines in a PAL can be applied to other than system designs. Normal methods of generating control signals from clock would result in a skew of at least $+/-6$ ns.

Figure 2:
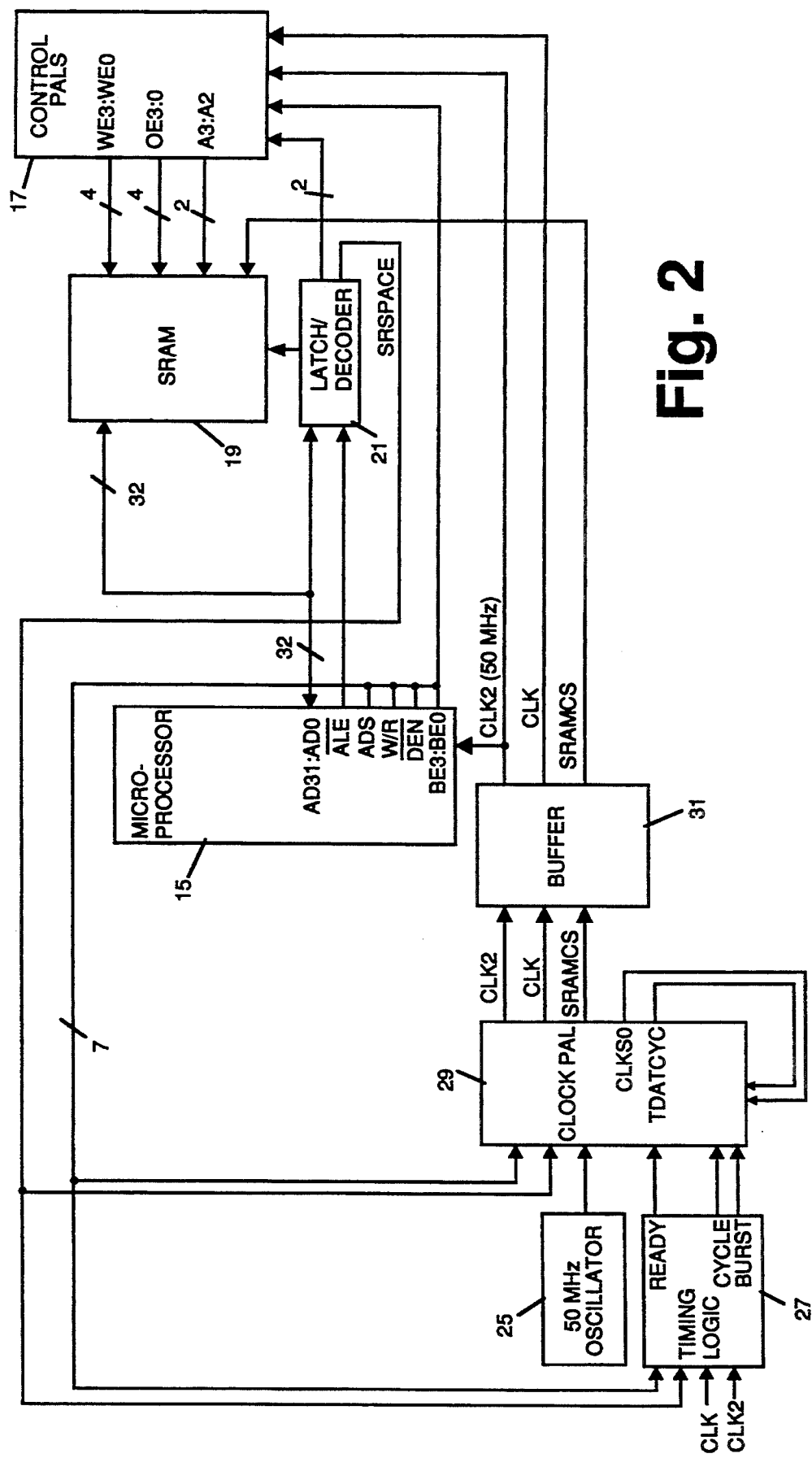
FIG. 2 is a block diagram of a microprocessor/SRAM system showing how the SRAM is accessed according to the present invention.

FIG. 2 is a block diagram showing how the present invention may be implemented. Specifically, as was the case with the prior art as shown in FIG. 1, the basic memory interface scheme utilizes microprocessor 15, PALs 17, SRAM 19, and address latch and decoder 21, each of which functions as is the case in the prior art, excepting that PALs 17 no longer generate the signal SRAMCS, and CLK2 and CLK are higher speed clocks, e.g., 50 MHz and 25 MHz instead of 40 MHz and 20 MHz. Additionally, PALs 17 also have as an input CLK2, and instead of the entire address latched by latch 21, only A3:A2 from the address bus is input to PALs 17. WE3:WE0 and OE3:OE0 are generated in the same manner as the prior art.

Also shown in FIG. 2 is timing logic 27 which, although not shown in FIG. 1 is used to generate the READY, CYCLE and BURST signals described below.

The main component which is new in the present invention is clock PAL 29 which is coupled to buffer 31. Buffer 31 is a common clock buffer such as an 74F244 and is used to provide buffering for the critical outputs of clock PAL 29. In this connection, clock PAL 29 is a PAL such as 16L8-7 PAL which has been programmed to generate the signals SRAMCS, CLK, and CLK2 according to the following equations.

$$\begin{aligned}
\text{SRAMCS} = &\ \text{TDATCYC} * \text{SRSPACE} * \text{CLKS0} * \text{WR} \\
&+ \text{TDATCYC} * \text{SRSPACE} * \text{CLK} * \overline{\text{WR}} \\
&+ \text{SRAMCS} * \text{SRSPACE} * \text{CYCLE} * \overline{\text{ICLK}} * \text{WR} \\
&+ \text{SRAMCS} * \text{SRSPACE} * \text{CYCLE} * \text{CLKS0} \\
&+ \text{SRAMCS} * \text{SRSPACE} * \text{CYCLE} * \overline{\text{READY}} \\
&+ \text{SRAMCS} * \text{CYCLE} * \overline{\text{WR}}
\end{aligned}$$

$$\begin{aligned}
\text{CLKS0} = &\ \text{CLK} * \overline{\text{ICLK}} \\
&+ \text{CLK} * \text{CLKS0} \\
&+ \text{CLKS0} * \text{ICLK}
\end{aligned}$$

$$\begin{aligned}
\text{TDATCYC} = &\ \text{ADS} * \overline{\text{DEN}} * \overline{\text{CLKS0}} * \overline{\text{CLK}} \\
&+ \text{BURST} \\
&+ \text{TDATCYC} * \text{CLK}
\end{aligned}$$

$$\begin{aligned}
\text{CLK} = &\ \text{CLK} * \overline{\text{ICLK}} \\
&+ \text{CLK} * \overline{\text{CLKS0}} \\
&+ \overline{\text{CLKS0}} * \text{ICLK}
\end{aligned}$$

$$\text{CLK2} = \overline{\text{ICLK}}$$

Figure 4:
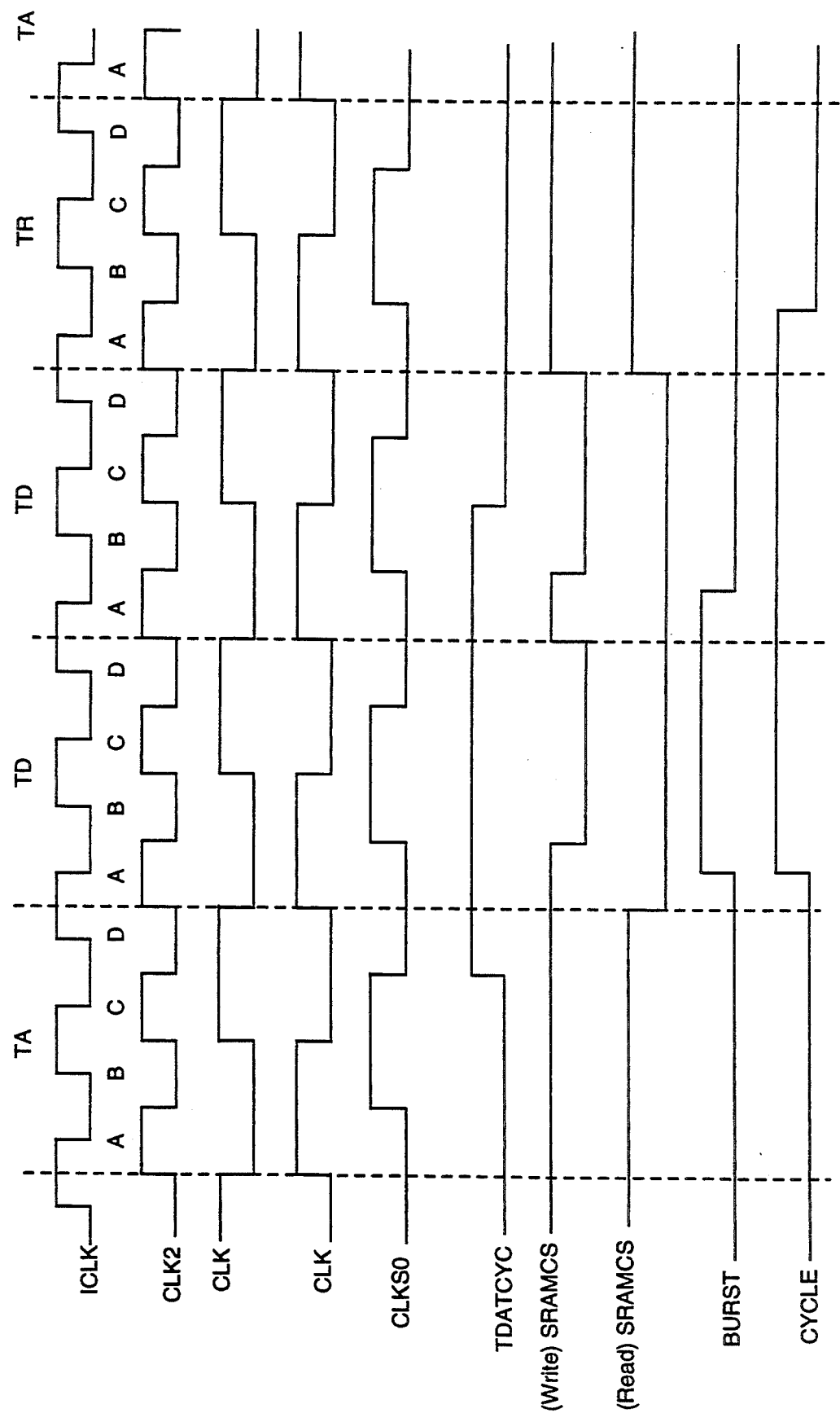
FIG. 4 is a timing diagram of the various clock and control signals generated and used according to the present invention, wherein all edges are referenced to the CLK2 output of PAL 29, except for ICLK.

TDATCYC changes from inactive to active when the next CLK cycle is a data cycle to the SRAM and from active to inactive when the next CLK cycle is a recovery cycle (see FIG. 4).

SRSPACE is active whenever the address on A0-:A31 is within the SRAM address space.

CYCLE is active at the beginning of the first data cycle following an address cycle and remains active until the beginning of the recovery cycle (see FIG. 4).

BURST is similar to CYCLE except it goes inactive at the beginning of the last data cycle before the recovery cycle (see FIG. 4). CYCLE and BURST are further described in Intel Publication EXV-960MC Executor Vehicle Reference Guide.

ADS is address/data status, an active low signal generated by the processor to indicate one address state. It is asserted during every TA state (see FIG. 4) and reasserted during the following TD state.

DEN is data enable, an active low signal generated by the microprocessor which is active during all TD states (see FIG. 4).

WR is the write/read signal generated by the microprocessor which is asserted during the TA state and remains valid during subsequent TD states and becomes inactive during the TR state.

READY is a signal generated by external logic that indicates that data on the local bus (the bus from the microprocessor to the SRAM) can be sampled (read) or removed (write). Details regarding the generation of the READY signal may be found in the 80960KB Hardware Designer's Reference Manual.

The signals ADS, DEN, WR and READY are described in a publication available from Intel Corporation known as the 80960KB Hardware Designer's Reference Manual.

Figure 3:
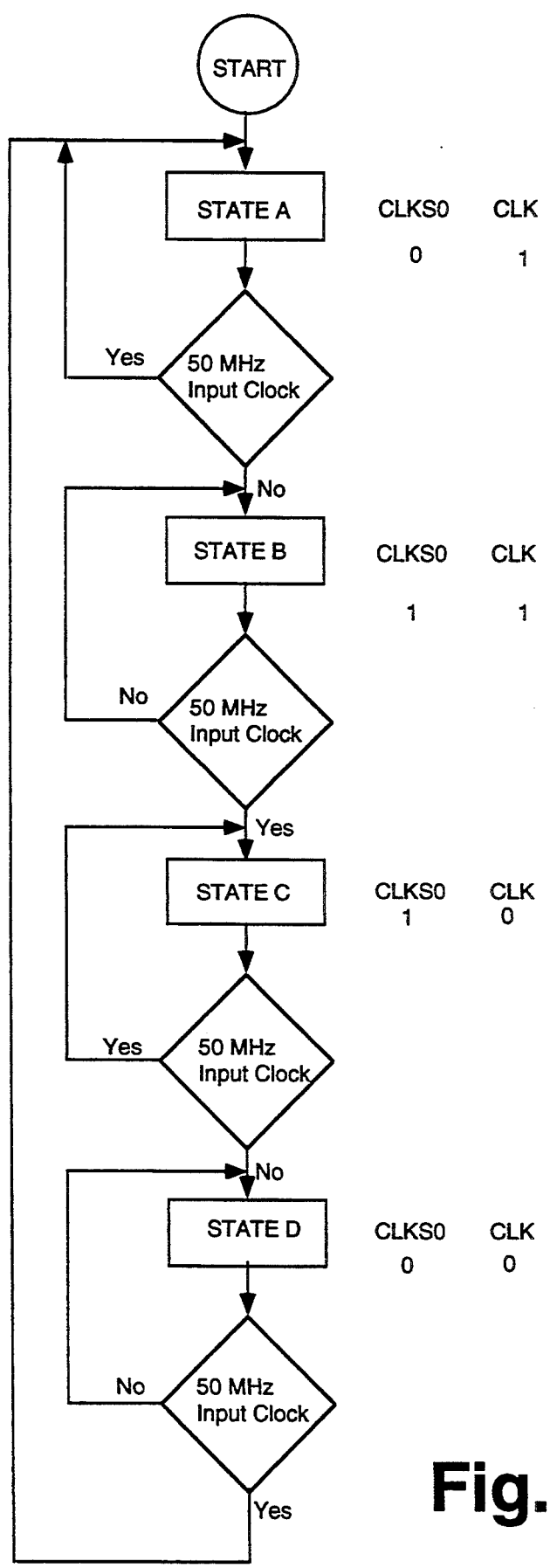
FIG. 3 is a state machine diagram illustration an asynchronous state machine implementation in PAL 29.

A state machine diagram of a four state (states A, B, C and D) state machine for generation the signals CLKS0 and CLK from the 50 MHz oscillator input clock (ICLK) is shown in FIG. 3. The four states are shown with reference to CLK2 in FIG. 4 as A, B, C and D.

In particular, the state machine implemented in clock PAL 29 operates as shown in FIGS. 3 and 4 as follows.

In state A, which is the first half cycle of CLK2, CLKS0 is 0 and CLK is 1 and the state machine stays in state A until ICLK goes to 0 at which time CLKS0 is 1 and CLK is 1 (state B, the next half cycle of CLK2). The state machine stays in state B until ICLK is 1 at which time it goes to state C (the next half cycle of CLK2), where CLKS0 is 1 and CLK is 0. The state machine stays in state C until ICLK goes to 0 at which time, in state D (the next half cycle of CLK2), CLKS0 is 0 and CLK is 0. The state machine remains in state D until ICLK goes to 1 at which time the state machine goes back to state A.

In this manner, the invention, by utilizing a relatively inexpensive PAL, implements a state machine which is used to generate systems clocks and control signals which are substantially without any skew, while at the same time providing for faster system clocks for a given oscillator frequency than can be obtained using prior art techniques.

I claim:

1. A circuit for substantially eliminating skew between a system clock signal and memory control signals in a microprocessor system, said microprocessor system including a random access memory (19) coupled to a microprocessor (15) over an address and data bus, and an oscillator 925), said circuit comprising:

a) a PAL (29) coupled to said oscillator for receiving a clocking signal generated by said oscillator, said PAL being programmed to generate at least one clock signal for use by said microprocessor (15) and at least one control signal for use by said random access memory (19), wherein said oscillator clocking signal has the same frequency as said at least one clock signal, said at least one control signal has a frequency which is different than the frequency of said at least one clock signal, and said at least one clock signal and said at least one control signal are synchronized such that the skew between said at least one clock signal and the at least one control signal is less than 2 ns at the end of a 40 ns clock period such that said random access memory operates with zero waitstates;

b) a buffer means (31) coupled between said PAL, said microprocessor and said random access memory for buffering said at least one clock signal and said at least one control signal generated by said PAL.

2. The circuit defined by claim 1 wherein the at least one clock signal for use by said microprocessor has the same frequency as the frequency of said oscillator.

3. The circuit defined by claim 1 wherein said PAL is programmed utilizing asynchronous state machines and asynchronous logic.

4. The circuit defined by claim 1 wherein said PAL is programmed according to PAL equations such that a memory chip select signal, SRAMCS, is generated by the equation:

$$\begin{aligned}SRAMCS = &\ TDATCYC * SRSPACE * CLKS0 * WR \\ &+ TDATCYC * SRSPACE * CLK * \overline{WR} \\ &+ SRAMCS * SRSPACE * CYCLE * \overline{ICLK} * WR \\ &+ SRAMCS * SRSPACE * CYCLE * \underline{CLKS0} \\ &+ SRAMCS * SRSPACE * CYCLE * \overline{READY} \\ &+ SRAMCS * CYCLE * \overline{WR},\end{aligned}$$

and the CLKSO signal is generated by the equation:

$$\begin{aligned}CLKS0 = &\ CLK * \overline{ICLK} \\ &+ CLK * CLKS0 \\ &+ CLKS0 * ICLK,\end{aligned}$$

and the TDATCYC signal is generated by the equation:

$$\begin{aligned}TDATCYC = &\ ADS * \overline{DEN} * \overline{CLKS0} * \overline{CLK} \\ &+ BURST \\ &+ TDATCYC * CLK,\end{aligned}$$

and the CLK signal is generated by the equation:

$$\begin{aligned}CLK = &\ CLK * \overline{ICLK} \\ &+ \underline{CLK * CLKS0} \\ &+ \overline{CLKS0} * ICLK,\end{aligned}$$

and the CLK2 signal is generated by the equation:

$$CLK2 = \overline{ICLK}.$$

5. The circuit defined by claim 1 further comprising control logic means (17) coupled to said microprocessor, said buffer means and said random access memory for generating additional control signals to control read and write accesses to said random access memory.

6. The circuit defined by claim 1 wherein trace routings of said at least one clock signal and said at least one control signal are created so that the trace length of the at least one control signal is less than or equal to the trace length of the at least one clock signal and the trace length of said address and data bus.

7. A circuit for substantially eliminating skew between a system clock signal and memory control signals in a microprocessor system, said microprocessor system including a static random access memory coupled to a microprocessor over an address and data bus, and an oscillator, said circuit comprising:

a) a PAL coupled to said oscillator for receiving a clocking signal generated by said oscillator, said PAL being programmed to generate at least one cock signal generated by said oscillator, said PAL being programmed to generate at least one clock signal for use by said microprocessor and at least one control signal for use by said random access memory, wherein said oscillator clocking signal has the same frequency as said at least one clock signal, said at least one control signal has a frequency which is different than the frequency of said at least one clock signal, and said at least one clock signal and said at least one control signal are synchronized such that the skew between said at least one clock signal and the at least one control signal is less than 2 ns at the end of a 40 ns clock period such that said static random acces memory operates with zero waitstates;

b) a buffer means (31) coupled between said PAL, said microprocessor and said random access memory for buffering said at least one clock signal and said at least one control signal generated by said PAL.

* * * * *